US007737015B2

(12) United States Patent
Kohli et al.

(10) Patent No.: US 7,737,015 B2
(45) Date of Patent: Jun. 15, 2010

(54) FORMATION OF FULLY SILICIDED GATE WITH OXIDE BARRIER ON THE SOURCE/DRAIN SILICIDE REGIONS

(75) Inventors: Puneet Kohli, Austin, TX (US); Craig Huffman, Krugerville, TX (US); Manfred Ramin, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 506 days.

(21) Appl. No.: 11/711,297

(22) Filed: Feb. 27, 2007

(65) Prior Publication Data

US 2008/0206988 A1    Aug. 28, 2008

(51) Int. Cl.
*H01L 21/3205* (2006.01)

(52) U.S. Cl. .................... 438/586; 438/592; 438/655; 438/664; 438/683

(58) Field of Classification Search ................. 438/233, 438/586, 592, 655, 664, 682, 683; 257/E21.165, 257/E21.439
See application file for complete search history.

(56) References Cited

U.S. PATENT DOCUMENTS

| 5,731,239 | A | * | 3/1998 | Wong et al. ................ 438/296 |
| 6,030,863 | A | * | 2/2000 | Chang et al. ................ 438/229 |
| 6,784,098 | B1 | * | 8/2004 | Lou ............................ 438/645 |
| 6,890,823 | B2 | * | 5/2005 | Lee et al. .................... 438/300 |
| 7,122,472 | B2 | | 10/2006 | Fang et al. |
| 7,151,023 | B1 | | 12/2006 | Nayfeh et al. |
| 2005/0287759 | A1 | | 12/2005 | Wang et al. |
| 2006/0084247 | A1 | | 4/2006 | Liu |

* cited by examiner

*Primary Examiner*—Mary Wilczewski
*Assistant Examiner*—Toniae M Thomas
(74) *Attorney, Agent, or Firm*—Jacqueline J. Garner; Wade J. Brady III; Frederick J. Telecky, Jr

(57) ABSTRACT

A simple and cost effective method of forming a fully silicided (FUSI) gate of a MOS transistor is disclosed. In one example, the method comprises forming a nitride hardmask overlying a polysilicon gate, forming an S/D silicide in source/drain regions of the transistor, oxidizing a portion of the S/D silicide to form an oxide barrier overlying the S/D silicide in the source/drain regions, removing the nitride hardmask from the polysilicon gate, and forming a gate silicide such as by deposition of a gate silicide metal over the polysilicon gate and the oxide barrier in the source/drain regions to form a fully silicided (FUSI) gate in the transistor. Thus, the oxide barrier protects the source/drain regions from additional silicide formation by the gate silicide metal formed thereafter. The method may further comprise selectively removing the oxide barrier in the source/drain regions after forming the fully silicided (FUSI) gate.

33 Claims, 8 Drawing Sheets

FORMATION OF FULLY SILICIDED GATE WITH OXIDE BARRIER ON THE SOURCE/DRAIN SILICIDE REGIONS

FIELD OF INVENTION

The present invention relates generally to semiconductor devices and more particularly to an innovative method of fabricating fully silicided metal gates (FUSI) in PMOS and NMOS transistor devices to minimize processing complexity and cost.

BACKGROUND OF THE INVENTION

It can be appreciated that several trends presently exist in the electronics industry. Devices are continually getting smaller, faster and requiring less power, while simultaneously being able to support and perform a greater number of increasingly complex and sophisticated functions. One reason for these trends is an ever increasing demand for small, portable and multifunctional electronic devices such as cellular phones, personal computing devices, and personal sound systems are devices which are in great demand in the consumer market.

Accordingly, there is a continuing trend in the semiconductor industry to manufacture integrated circuits (ICs) with higher device densities by scaling down dimensions (e.g., at submicron levels) on semiconductor wafers. To accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yield in IC fabrication processes by providing or 'packing' more circuits on a semiconductor die and/or more die per semiconductor wafer, for example.

One way to increase packing densities is to decrease the thickness of transistor gate dielectrics to shrink the overall dimensions of transistors used in IC's and electronic devices. Transistor gate dielectrics (e.g., silicon dioxide or nitrided silicon dioxide) have recently been reduced considerably to reduce transistor sizes and facilitate improved performance. Thinning gate dielectrics can have certain drawbacks, however. For example, a polycrystalline silicon ("polysilicon") gate overlies the thin gate dielectric, and polysilicon naturally includes a depletion region where it interfaces with the gate dielectric. This depletion region can provide an insulative effect rather than conductive behavior, which is desired of the polysilicon gate since the gate is to act as an electrode for the transistor.

By way of example, if the depletion region acts like a 0.8 nm thick insulator and the gate dielectric is 10-nm thick, then the depletion region effectively increases the overall insulation between the gate and an underlying transistor channel by eight percent (e.g., from 10 nm to 10.8 nm). It can be appreciated that as the thickness of gate dielectrics are reduced, the effect of the depletion region can have a greater impact on dielectric behavior. For example, if the thickness of the gate dielectric is reduced to 2 nm, the depletion region would effectively increase the gate insulator by about 40 percent (e.g., from 2 nm to 2.8 nm). This increased percentage significantly reduces the benefits otherwise provided by thinner gate dielectrics.

Metal gates can be used to mitigate adverse effects associated with the depletion region phenomenon because, unlike polysilicon, little to no depletion region manifests in metal. Interestingly enough, metal gates were commonly used prior to the more recent use of polysilicon gates. An inherent limitation of such metal gates, however, led to the use of polysilicon gates. In particular, the use of a single work function metal proved to be a limitation in high performance circuits that require dual work function electrodes for low power consumption. The work function is the energy required to move an electron from the Fermi level to the vacuum level. In modern CMOS circuits, for example, both p-channel MOS transistor devices ("PMOS") and n-channel MOS transistor devices ("NMOS") are generally required, where a PMOS transistor requires a work function on the order of 5 eV and an NMOS transistor requires a work function on the order of 4 eV. A single metal may not be found, however, which can produce a metal gate that provides such different work functions. Polysilicon gates are suited for application in CMOS devices since some of the gates can be substitutionally doped in a first manner to achieve the desired work function for PMOS transistors and other gates can be substitutionally doped in a second manner to achieve the desired work function for NMOS transistors. However, polysilicon gates suffer from the aforementioned gate depletion.

Fully silicided (FUSI) gates eliminate the problem of polysilicon depletion. FUSI gates also reduce the gate conductance that can further improve device performance. A FUSI gate can be formed by depositing a metal layer (such as Ni, Ti, Co, etc.) over an exposed polysilicon gate region, pre-annealing to provide the required diffusion, removing the unreacted metal, and then annealing the semiconductor structure to form a more stable silicide phase. The deposited metal reacts with the exposed polysilicon gate to transform the polysilicon gate fully into a silicided gate. FUSI gates normally have a work function near the middle of the silicon band structure. However, CMOS devices normally require a conductive gate with a work function near the band edge; i.e., near the conduction band for an NMOS device and near the valence band for a PMOS device, respectively. Thus, for CMOS technologies with FUSI gates, the different work functions required for each of the NMOS and PMOS portions of the CMOS device may also need to be provided by the substitutional doping process.

In addition, the doped silicide gate electrodes of the MOS devices are typically formed to be much thicker than the depth of the silicide formed in the source/drain (S/D) regions. Because of these differing thicknesses, the gate silicidation is usually formed separate from the S/D silicidation, typically separated by a complex and costly CMP process.

Consequently, it would be desirable to be able to form a fully silicided gate of a MOS transistor using a simple and cost effective process that may be employed in the fabrication of high density MOS devices.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to a simple and cost effective method of forming MOS transistors having fully silicided (FUSI) gates. In one example, a source/drain (S/D) region silicide is first formed and partially oxidized to form a protective oxide barrier that blocks subsequent gate silicidation from adding to the S/D silicide. As is generally required, this method allows the gate silicide to be formed thicker than the S/D silicide without the use of a costly and complex chemical mechanical polishing (CMP) process conventionally used between the S/D silicide and gate silicide formations. Thus, the method provides a simple solution to conventional independent S/D and gate silicidation approaches requiring a complex and costly CMP process. In addition, the method still permits the use of one or more metal species to be deposited, sputtered, or implanted, one or more annealing operations per silicide formation, and one or more annealings to be combined in a single annealing. The method also facilitates CoSi S/D silicide and Ni gate silicide formation without the use of a CMP process. The FUSI gates of the transistors allow device dimensions, such as gate dielectric thicknesses, for example, to be reduced to facilitate increased packing densities. Additionally, the transistors can be efficiently formed as part of a CMOS fabrication process.

According to one or more aspects of the present invention, a method of forming a fully silicided (FUSI) gate of a MOS transistor is disclosed. The method includes forming a hardmask such as a nitride hardmask overlying a silicon-containing gate such as a polysilicon gate, forming an S/D silicide in source/drain regions of the transistor, and forming a barrier such as an oxide barrier or another such silicide blocking layer over the S/D silicide in the source/drain regions such as by oxidizing a portion of the S/D silicide to form an oxide barrier overlying the S/D silicide in the source/drain regions. The method also includes removing the hardmask from the silicon-containing gate, and forming a gate silicide over the polysilicon gate to form a fully silicided (FUSI) gate in the transistor. Thus, the barrier or oxide barrier protects the source/drain regions from additional silicide formation by the gate silicide metal.

In accordance with another aspect, the method may further comprise selectively removing the oxide barrier in the source/drain regions after forming the fully silicided (FUSI) gate.

According to one or more other aspects of the present invention, another method of forming a fully silicided (FUSI) gate of a MOS transistor is disclosed. The method includes comprises forming a hardmask such as a nitride hardmask or another such blocking layer overlying a silicon-containing gate such as a polysilicon gate, and depositing an S/D silicide metal in source/drain regions of the transistor to form an S/D silicide in the source/drain regions. The method also includes forming a barrier such as an oxide barrier or another such silicide blocking layer over the S/D silicide in the source/drain regions such as by oxidizing a portion of the S/D silicide to form an oxide barrier overlying the S/D silicide in the source/drain regions, removing the hardmask from the silicon-containing gate, and depositing a gate silicide metal over the silicon-containing gate and the barrier in the source/drain regions to form a fully silicided (FUSI) gate in the transistor. Thus, the barrier protects the source/drain regions from additional silicide formation by the gate silicide metal.

In another aspect, the method further comprises selectively removing any unreacted gate or S/D silicide metal from the transistor, and annealing to form a fully silicided (FUSI) gate for the MOS transistor.

According to one or more other aspects of the present invention, a method of forming a fully silicided (FUSI) gate transistor is disclosed. The method includes forming a hardmask such as a nitride hardmask or another such blocking layer overlying a polysilicon gate, providing an S/D silicide metal in source/drain regions of the transistor to form an S/D silicide in the source/drain regions, and oxidizing a portion of the S/D silicide to form an oxide barrier overlying the S/D silicide in the source/drain regions. The method further comprises removing the nitride hardmask and a pad oxide layer overlying the polysilicon gate, and providing a gate silicide metal over the polysilicon gate and the oxide barrier in the source/drain regions to form a fully silicided (FUSI) gate in the transistor, the oxide barrier thereby protecting the source/drain regions from additional silicide formation by the gate silicide metal. The method also includes selectively removing any unreacted gate or S/D silicide metal from the transistor, annealing the fully silicided (FUSI) gate of the MOS transistor, and selectively removing the oxide barrier in the source/drain regions.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced; subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Figure 1:
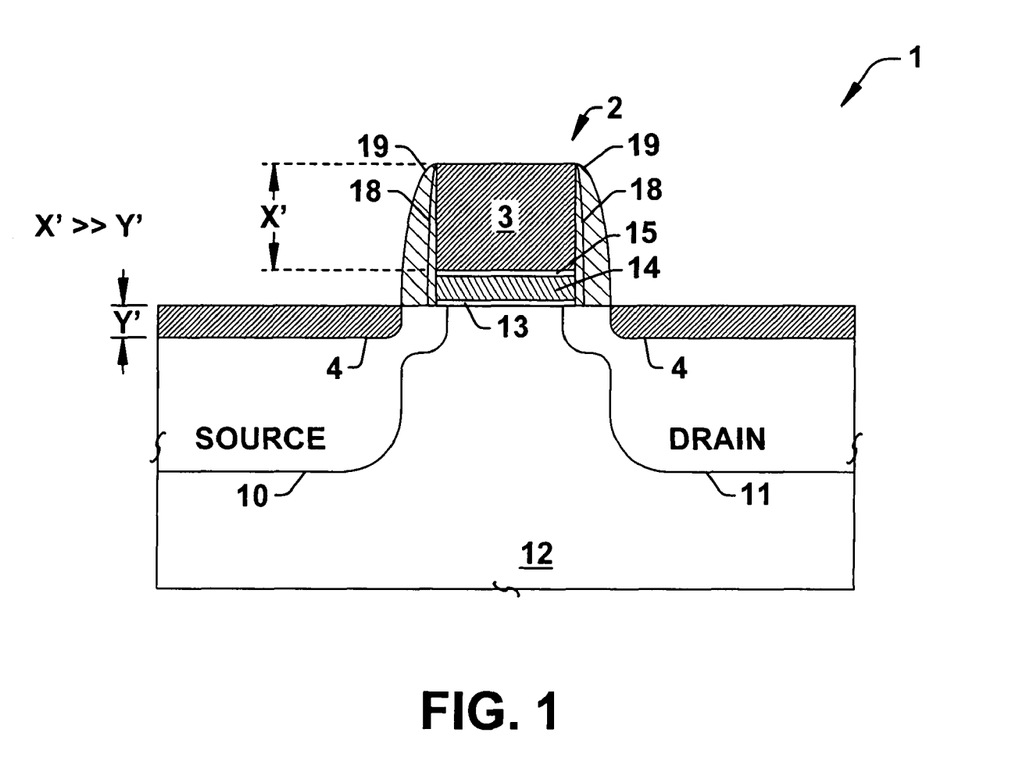
FIG. 1 is a fragmentary cross sectional diagram illustrating a problem in the conventional formation of an exemplary FUSI gate transistor such as may be formed in accordance with one or more aspects of the present invention.

Turning to FIG. 1, a problem is illustrated in the conventional formation of an exemplary FUSI gate transistor 1 such as may be formed in accordance with one or more aspects of the present invention. For example, the transistor 1 of FIG. 1 comprises a fully silicided (FUSI) gate 2 formed over source 10 and drain 11 regions within a semiconductor substrate 12. Conventionally, in a floating gate flash memory device, an ONO stack may be formed overlying the substrate 12, the ONO stack typically comprising a gate oxide layer (GOX) 13, an overlying nitride floating gate layer 14, and an upper or top oxide (Top OX) layer 15. The FUSI gate 2 also comprises a polysilicon gate material which is silicided by the addition of a gate silicide metal such as Ni, Ti, and Co, for example, forming the silicide alloy such as NiSi in the control gate (CG) 3 portion of the FUSI gate 2.

In a similar manner, an S/D silicide 4 is formed in the source/drain regions 10/11 by silicidation of the exposed polysilicon 12 using an S/D silicide metal. Offset spacers (OS) 18 and side-wall spacers (SWS) 19, initially used to implant dopants into the source/drain regions 10/11, may also be subsequently used to guide the formation of the S/D silicidation 4, for example, using a deposition, sputtering, or ion implantation process. The gate silicide metal and the S/D silicide metal may be the same or different metal species.

FIG. 1 also illustrates that the thickness X' of the gate silicide 3 is much thicker than the thickness Y' of the S/D silicide 4. Thus, for the thicker gate polysilicon layer to become fully silicided, it is generally required that the gate silicide metal be deposited thicker than the S/D silicide metal over the S/D silicide 4. Because of these differing thicknesses and/or the differing thermal budget requirements, the gate silicidation is usually formed separate from the S/D silicidation, typically separated by a costly and complex chemical mechanical polishing (CMP) process between the S/D silicide and gate silicide formations.

In one embodiment of the present invention, a source/drain (S/D) region silicide is first formed and partially oxidized to form a protective oxide barrier that blocks a subsequent gate silicidation from adding to the S/D silicide. Accordingly, the method of the present invention allows the gate silicide to be formed thicker than the S/D silicide without the use of the costly and complex CMP process, and provides a simple solution to conventional independent S/D and gate silicidation approaches.

Figure 2A:
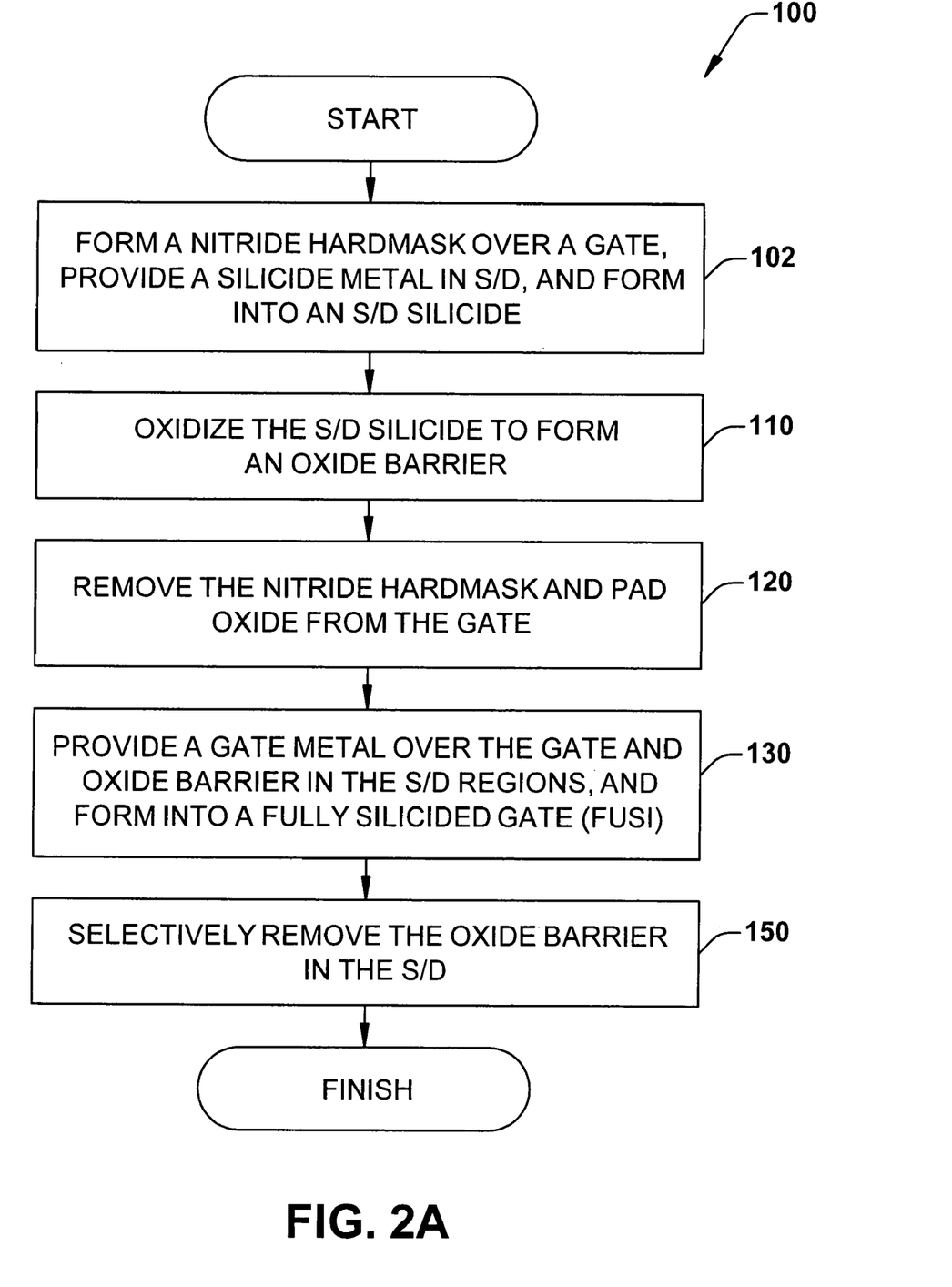
FIGS. 2A, 2B and 2C are flow diagrams illustrating one or more exemplary methodologies for forming an exemplary FUSI gate transistor according to one or more aspects of the present invention.
Figure 2B:
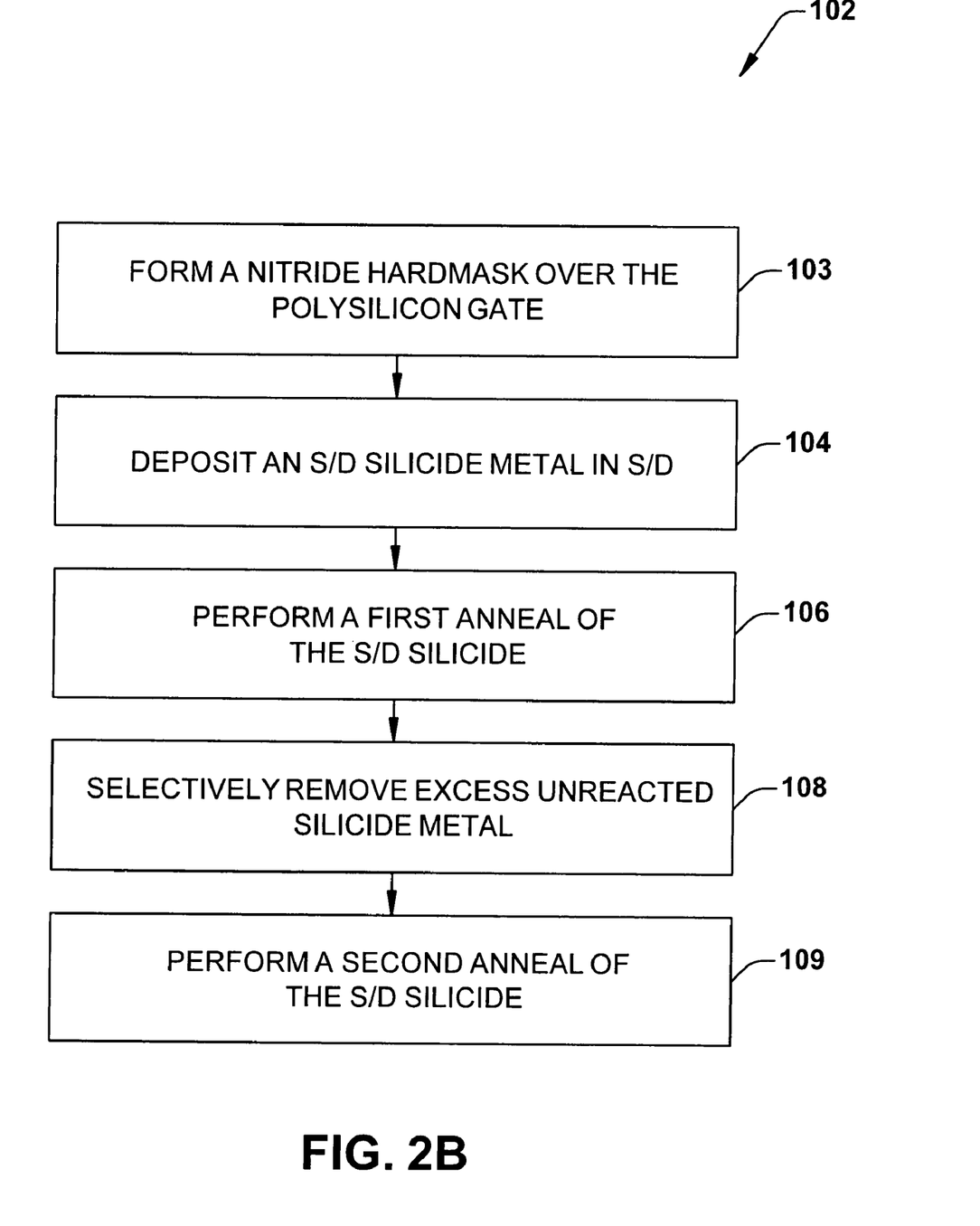
Figure 2C:
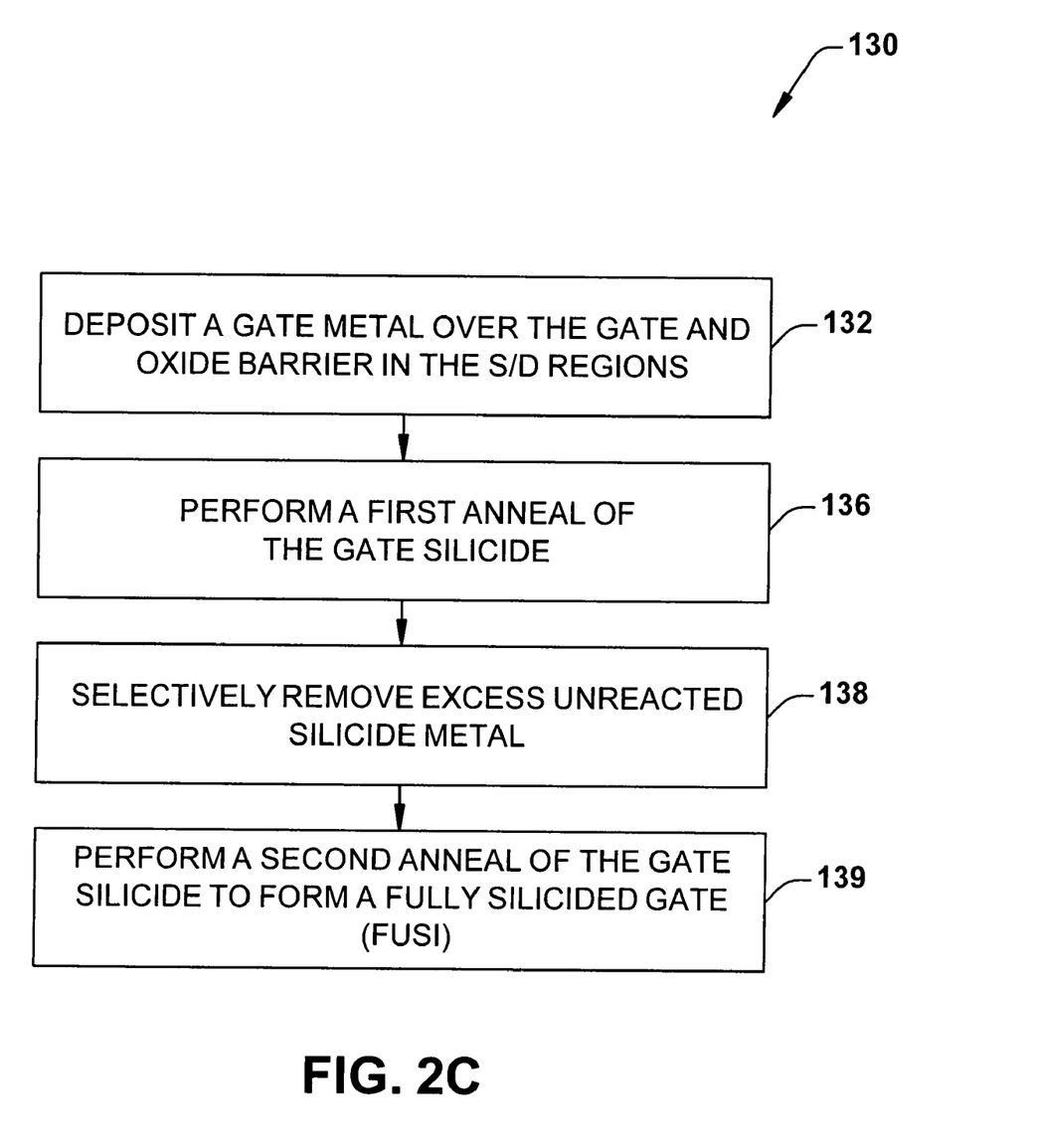

FIGS. 2A, 2B and 2C, for example, illustrate one or more exemplary methodologies for forming an exemplary FUSI gate transistor according to one or more aspects of the present invention.

In FIG. 2A, an exemplary methodology 100 is illustrated for forming metal gate transistors according to one or more aspects of the present invention, for example, as is illustrated in the FUSI gate fabrication steps of a MOS transistor 20 of FIGS. 3A-3H. As with all methodologies discussed herein, although the methodology 100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 3A:
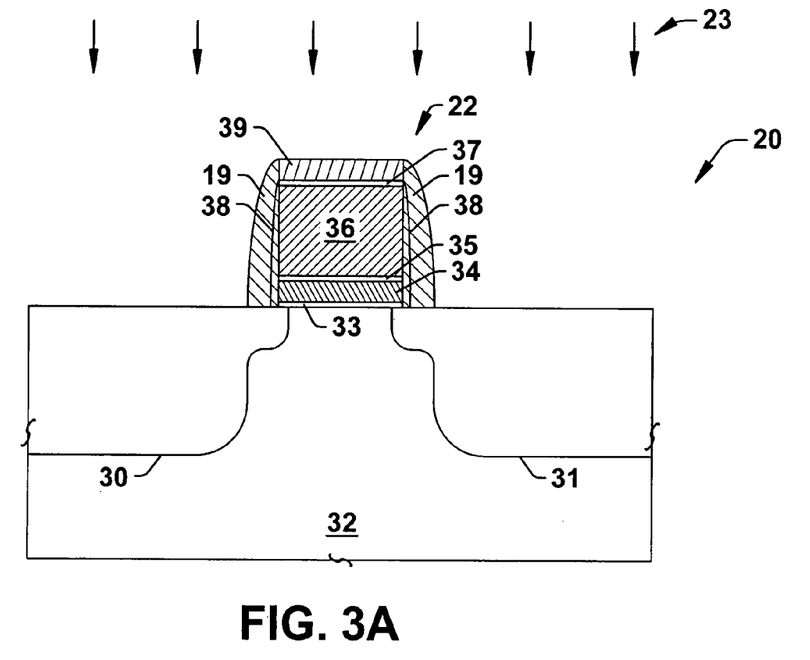
FIGS. 3A-3H are fragmentary cross sectional diagrams illustrating the formation of an exemplary FUSI gate transistor according to one or more aspects of the present invention, such as by the methodology set forth in FIGS. 2A, 2B and 2C.

The methodology 100 begins at 102, wherein a hardmask such as nitride hardmask 39 (e.g., FIG. 3A) or another such blocking layer is formed (e.g., by deposition 23 of nitride 39 of FIG. 3B) over a gate (e.g., silicon-containing gate, polysilicon control gate 36 of FUSI gate 22 of FIG. 3A). Also at 102, a silicide metal (e.g., S/D silicide metal 41 of FIG. 3B) is provided 42 (e.g., by deposition, sputtering, or ion implantation) into the polysilicon 32 of source/drain (S/D) regions (e.g., 30 and 31 of FIG. 3B) formed within a semiconductor substrate 32, and a silicide is formed therefrom, for example, by forming the polysilicon source/drain regions 30/31 and S/D silicide metal 41 into a silicide alloy (e.g., a nickel S/D silicide metal 41 provided (e.g., by deposition or implantation) in the polysilicon of the source/drain regions 30/31 may be formed initially into an $Ni_2Si/NiSi$ alloy in an S/D silicide 43 of FIGS. 3B and 3C and after annealing into a more stable phase NiSi S/D silicide 83 of FIGS. 3G and 3H). Further details of an exemplary S/D silicide formation 102 will be shown in association with FIG. 2B hereafter.

It will be appreciated that 'substrate' 32 as referred to herein may comprise any type of semiconductor body (e.g., formed of silicon or SiGe) such as a semiconductor wafer or one or more die on a wafer, as well as any other type of semiconductor and/or epitaxial layers associated therewith.

Figure 3B:
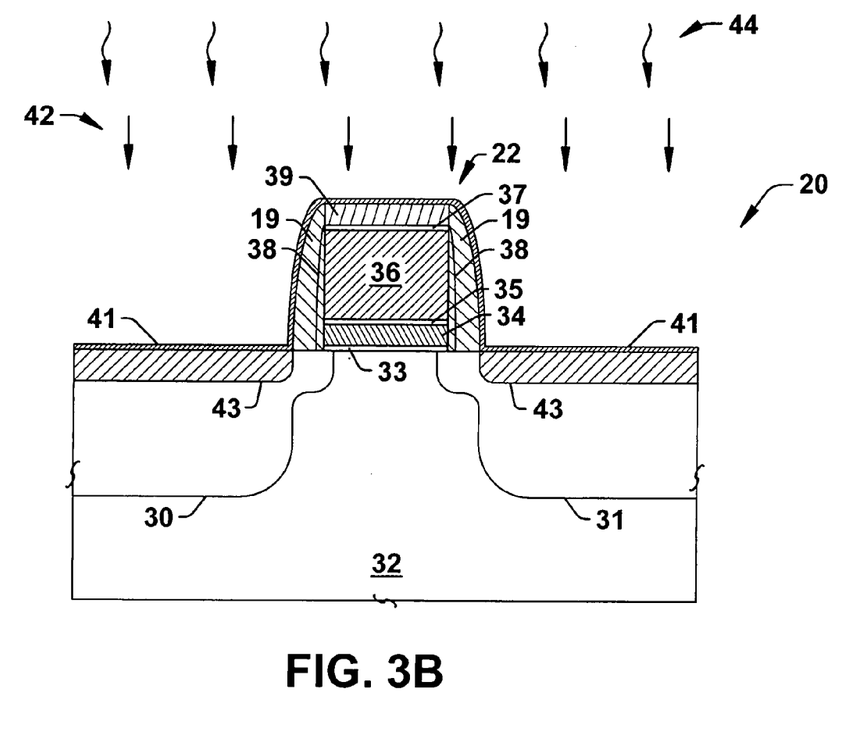
Figure 3C:
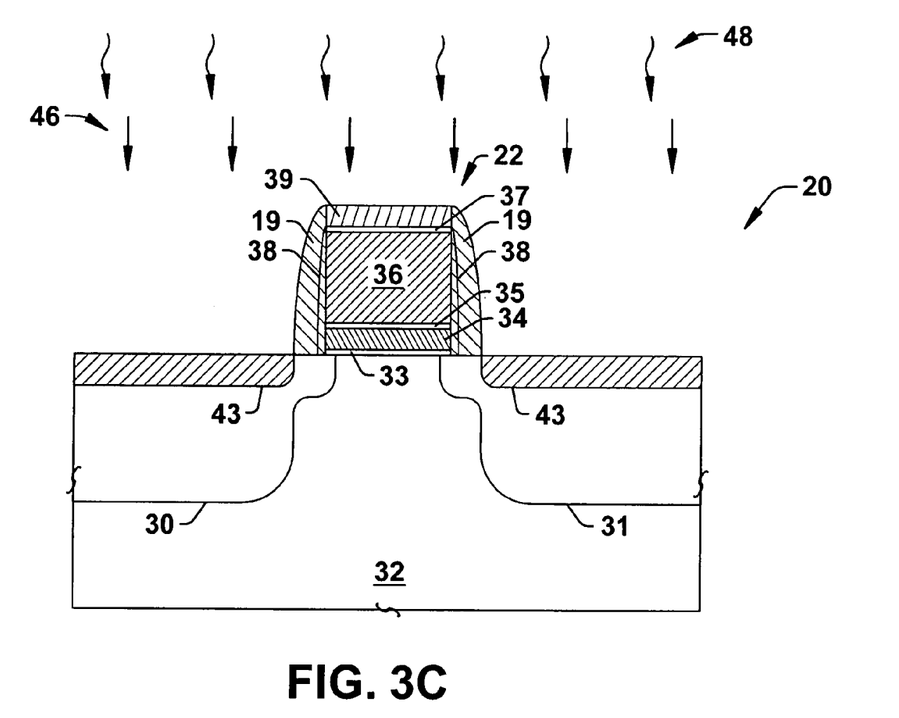
Figure 3D:
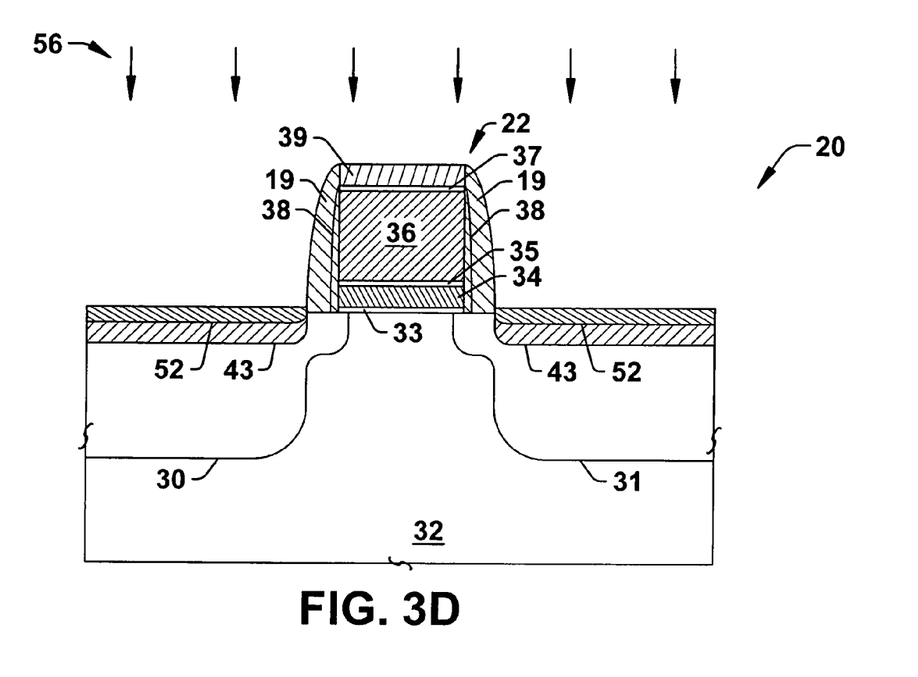

At 110, the S/D silicide 43 (e.g., or a portion of the S/D silicide 43) is oxidized to form a protective oxide barrier 52, for example, using an oxidation process 56 of FIG. 3D. The protective oxide barrier 52 is used to block a subsequent gate silicidation process from adding to the S/D silicide, thereby maintaining the S/D silicide at the desired thickness Y (FIG. 3H), where X>>Y (read: X is much greater than Y), without the use of costly and complex CMP processing between the S/D silicide and gate silicide formations. It will be appreciated, however, that any ratio where X is greater than Y (X>Y) is also anticipated, particularly if technological changes allow much thinner gate polysilicon structures 36. The inventors have further appreciated that the S/D silicide will easily oxidize to form the protective oxide barrier 52 at relatively low temperatures, and may also be combined with an S/D silicide $2^{nd}$ anneal operation discussed in association with additional details of step 102 infra.

Figure 3E:
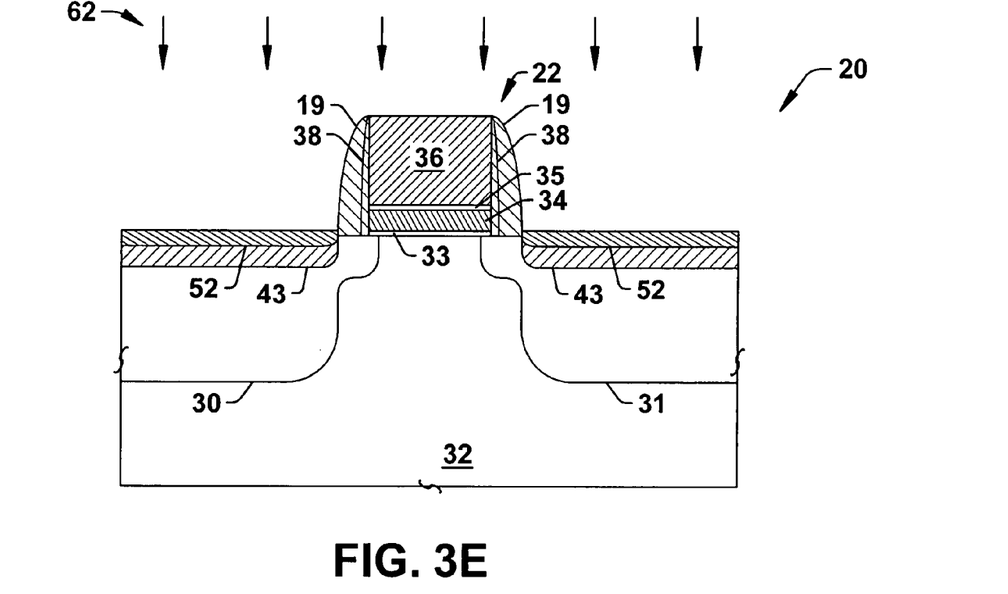

At 120 the nitride hardmask 39 is removed (e.g., by an etch process 62 of FIG. 3E). Alternately, a thin intermediate pad oxide (PADOX) layer 37 (FIG. 3D) may have been deposited underlying the nitride hardmask 39, and in this case, the PADOX layer 37 would also be removed with the nitride hardmask 39. The inventors of the present invention have also appreciated that a portion of the oxide barrier 52 will be removed along with the removal of the hardmask 39 and the PADOX layer 37, therefore, the oxide barrier 52 is formed sufficiently to a thickness that is greater than the PADOX layer 37, to compensate for the removal, thereby maintaining adequate protection of the underlying S/D silicide 43 from a subsequent gate silicide 94 formation.

At 130 a gate silicide metal (e.g., gate silicide metal 76 of FIG. 3F) is provided (e.g., by deposition, sputtering, or ion implantation) 72 over the polysilicon gate 36 (FIG. 3B) and the protective oxide barrier 52 in the source/drain regions 30/31, and is formed into a fully silicided FUSI gate therefrom. For example, by forming the polysilicon gate 36 and S/D silicide metal 41 into a silicide alloy (e.g., a nickel gate silicide metal 76 added to the polysilicon of the polysilicon control gate 36 may be initially formed into an $Ni_2Si/NiSi$ gate silicide 74 of FIG. 3F and a into more stable phase NiSi gate silicide 84 of 3G and 3H after annealing). Further details of an exemplary gate silicide formation 130 will be shown in association with FIG. 2c hereafter.

Optionally, and thereafter at 150, the protective oxide barrier 52 of oxidized silicide may be removed 92, for example, by stripping or etching, from the S/D silicide 83 prior to subsequent S/D contact formation (not shown).

FIG. 2B illustrates a further embodiment of the nitride hardmask deposition process 23 and S/D silicidation process loop of step 102 of FIG. 2A. For example, at 103 the nitride hardmask is formed over the polysilicon control gate CG 36 of the FUSI gate 22 of the MOS transistor 20 of FIG. 3A. The nitride hardmask 39 provides a capping material formed over the polysilicon to prevent certain atoms, such as boron dopant atoms, for example, from entering (e.g., being deposited into) the polysilicon 36 of the FUSI gate 22. As indicated previously, an intermediate pad oxide layer PADOX 37 may be also deposited overlying the polysilicon gate 36, before the nitride hardmask 39 is deposited over the FUSI gate 22.

At step 104, an S/D silicide metal 41 is then provided to the source/drain region 30/31 (or over the entire device) of the MOS transistor 20, such as by a deposition and/or implantation process 42, for example, as illustrated in FIGS. 3A and 3B, for example. The S/D silicide metal 41 reacts with the exposed polysilicon 32 of the source/drain region 30/31 to form a silicide alloy, for example a $Ni_2Si$ and NiSi silicide alloy in these regions.

At 106 a first anneal 44 is performed on the S/D silicide metal 41 to begin the formation of the S/D silicide 43 in the source/drain regions 30/31 of the MOS transistor 20, as illustrated in FIG. 3B, for example.

At 108, the unreacted S/D silicide metal 41 is selectively removed 46, for example, by an etch process 46, as illustrated in FIG. 3C, leaving only the reacted S/D silicide 43 in the source/drain regions 30/31 of the MOS transistor 20.

Finally, at 109, an optional $2^{nd}$ anneal 48 is performed on the S/D silicide metal 41 to complete the formation of the S/D silicide 43 in the source/drain regions 30/31 of the MOS transistor 20, as illustrated in FIG. 3C, for example.

It will be appreciated, in the context of the present invention, that the second anneal of the S/D silicide 43, wherein a more stable phase NiSi silicide alloy is formed as described in step 109, may be combined with another subsequent annealing operation. For example, the first gate silicide annealing 78 or the second gate silicide annealing 86 discussed further in association with the FUSI silicidation formation of step 130, may be combined with the second anneal of the S/D silicide 43.

Figure 3F:
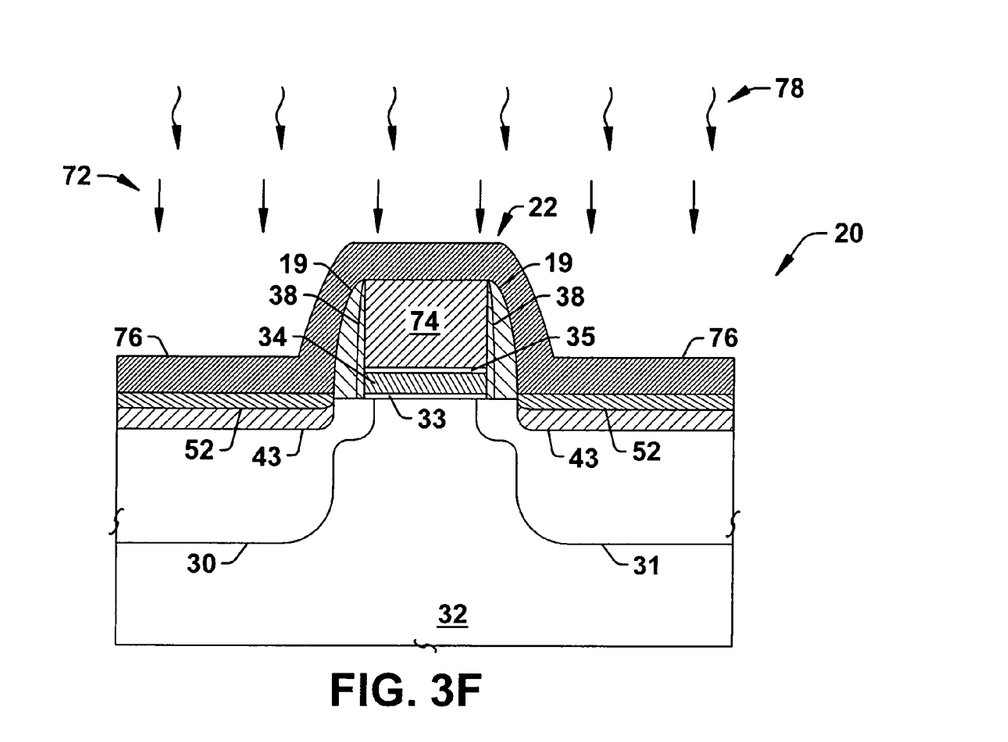

FIG. 2C illustrates a further embodiment of the gate silicidation process loop of step 130 of FIG. 2A. For example, at 132 a thick gate silicide metal 76 is then provided 72 over the MOS transistor 20, as illustrated in FIG. 3F, for example. The gate silicide metal 76 may be added to the gate polysilicon 36, such as by a deposition and/or implantation process 72, for example. The gate silicide metal 76 reacts with the exposed gate polysilicon 36 to form a silicide alloy, for example a $Ni_2Si$ and NiSi silicide alloy in the gate 22. The gate silicide metal 76 is used to set or establish a particular work function in the gate 22. To establish a work function for a PMOS type transistor, for example, the gate silicide metal 76 may comprise Co, Ni, Se, Rh, Pd, Te, Re, Ir, Pt and/or Au, for example, and may have a work function of between about 4.8 eV and about 6.0 eV, for example. To establish a work function for an NMOS type transistor, for example, the gate silicide metal 76 may comprise Sc, Y, La, Yb, Er, Cs, Ba, Ti, V, Fe, Nb, Cd, Sn, Hf, Ta, Zr, lanthanides and/or actinides, for example, and may have a work function of between about 3.0 eV and about 4.3 eV, for example.

In another aspect of the present invention, the S/D and gate silicide metals 41 and 76, respectively, may be formed from different species, the same species, or various combinations of metal species which provides the appropriate needed work function. For example, a CoSi S/D silicide and a Ni gate silicide may be easily formed using the method of the present invention without requiring a CMP process as in prior art.

It will also be appreciated that the respective amounts of the S/D and gate silicide metals added to the polysilicon 32 and 36, respectively, can be varied to adjust the work function of the transistor.

At 136 a first anneal 78 is performed on the gate silicide metal 76 to begin the formation of the gate silicide 74 in the control gate 74 of the MOS transistor 20, as illustrated in FIG. 3F, for example.

Figure 3G:
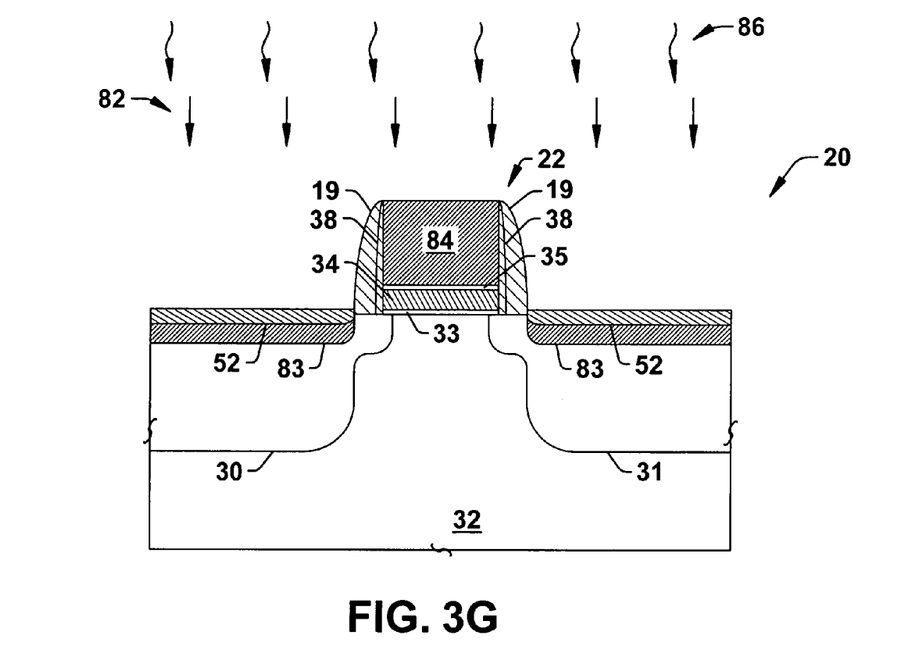

At 138, the unreacted gate silicide metal 76 is selectively removed 46, for example, by an etch process 82, as illustrated in FIG. 3G, leaving only the reacted gate silicide 74 in the control gate 74 of the MOS transistor 20.

Figure 3H:
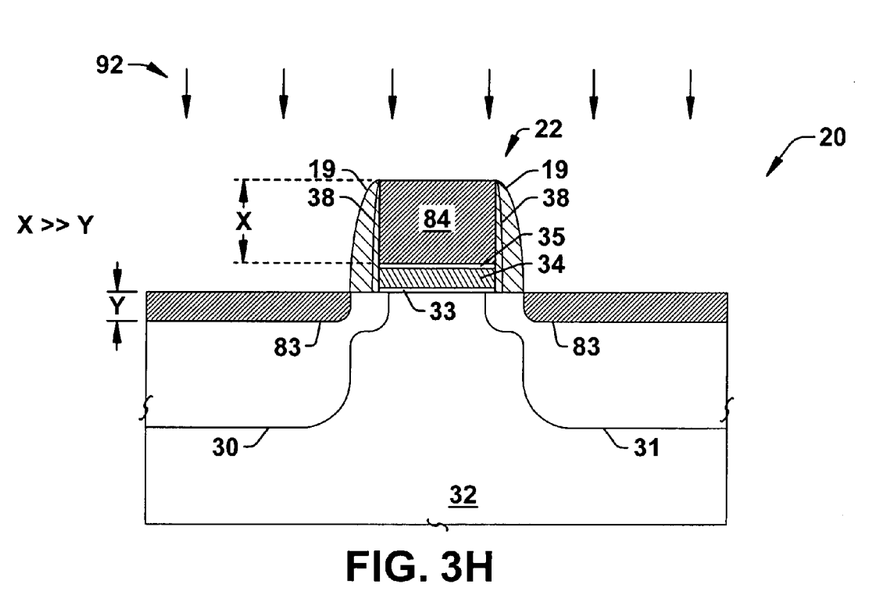

Finally, at 139, a $2^{nd}$ anneal 86 is performed on the gate silicide metal 74 to complete the silicide formation into a fully silicided FUSI gate 84 for the MOS transistor 20, as illustrated in FIGS. 3G and 3H, for example, wherein FIG. 3H further illustrates the removal 92 of the oxidized silicide or barrier oxide layer 52, for the complete formation of the S/D silicide 83. It will be appreciated in the context of the present invention that the oxidized silicide 52 which protects the S/D silicide 83, may be removed 92 anytime after the FUSI gate 84 has been formed, for example, later at a contact etch step.

Accordingly, one or more silicidation processes are performed at 102 and 130 wherein heat is applied (e.g., annealing) to form a first alloy such as the S/D silicide 43 and 83 in the source/drain regions 30/31, and a second alloy such as the fully silicided FUSI gate 84 in the gate 22 (FIGS. 3G and 3H) of the MOS transistor 20. It will be appreciated that, as with all silicidation (e.g., heating, annealing) processes described herein, this process can be performed in an inert ambient at a temperature of between about 300 and about 1000 degrees Celsius for between about 10 seconds to about 5 minutes, for example. Additionally, the resulting alloys may have respective thicknesses of about 100 nanometers or less, for example.

It will be appreciated that, according to one or more aspects of the present invention, the S/D silicide metal 41 and gate silicide metal 76 form stable alloys within the respective polysilicon areas during the silicidation process, for example, for forming one or more NMOS or PMOS type transistors 20.

Although not illustrated, it will be appreciated that other aspects of the transistor fabrication can also be done before S/D silicide and gate silicide metals are provided and the silicidation process is performed. These include doping the substrate 32 to establish source and drain regions therein adjacent to the gate structures, thereby establishing respective channel regions under the gate structures between the source and drain regions, LDD, MDD, or other extension implants, appropriate dopant activation anneals for source-drain, LDD and MDD dopants, and left and right sidewall spacer formation along left and right lateral sidewalls of the respective gate structures. Further metallization, and/or other back-end processing can also be subsequently performed.

Additionally, it will also be appreciated that the polysilicon 36, as well as the dielectric material 33, can be patterned before the metals are provided and the silicidation process is performed. In this scenario, selective masking/patterning may need to be implemented to inhibit these, as well as other, materials from being imparted into exposed regions of the substrate 32, for example.

Further, forming FUSI gate transistors as described herein can be implemented in a CMOS fabrication process in an efficient and cost effective manner.

Accordingly, forming transistors according to one or more aspects of the present invention allows different types of FUSI gate transistors having different respective work functions to be concurrently formed in a single fabrication process. Forming the different types of transistors allows their respective advantages to be taken advantage of to satisfy different circuit application requirements. The FUSI gate transistors also allow feature sizes, such as dielectric thicknesses, for example, to be reduced to facilitate device scaling and increase packing densities.

Thus, in accordance with the methods of the present invention, once the S/D silicide is formed, the protective oxide barrier 52 is used to block a subsequent gate silicidation process from adding to the S/D silicide, thereby maintaining the S/D silicide at the desired thickness Y (FIG. 3H), where the gate silicide is greater than the S/D silicide thickness (X>Y, or X>>Y), without the use of costly and complex CMP processing between the S/D silicide and gate silicide formations.

It will be appreciated that while reference is made throughout this document to exemplary structures in discussing aspects of methodologies described herein (e.g., those structures presented in FIGS. 3A-3H while discussing the methodology set forth in FIGS. 2A, 2B and 2C, that those methodologies are not to be limited by the corresponding structures presented. Rather, the methodologies (and structures) are to be considered independent of one another and able to stand alone and be practiced without regard to any of the particular aspects depicted in the figures.

It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. For example, it will be appreciated that the hardmask blocking layer 39 overlying the polysilicon gate 36 can be very thin. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example. Further, the term "exemplary" as used herein merely meant to mean an example, rather than the best.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a fully silicided (FUSI) gate of a MOS transistor, comprising:
   a) forming a hardmask overlying a silicon-containing gate;
   b) forming a source/drain silicide in source/drain regions of the transistor;
   c) forming a barrier over the source/drain silicide in the source/drain regions, wherein the forming of the barrier over the source/drain silicide comprises oxidizing a portion of the source/drain silicide to form an oxide barrier overlying the source/drain silicide in the source/drain regions;
   d) removing the hardmask from the silicon-containing gate; and
   e) forming a gate silicide over the silicon-containing gate to form a fully silicided (FUSI) gate in the transistor, wherein the oxide barrier protects the source/drain regions from additional silicide formation.

2. The method of claim 1, wherein the hardmask comprises one of a nitride hardmask and a blocking layer.

3. The method of claim 1, wherein the formation of the source/drain silicide in the source/drain regions of the transistor comprises:
   b1) depositing a source/drain silicide metal in the source/drain regions of the transistor;
   b2) first annealing to form the source/drain silicide in the source/drain regions;
   b3) selectively removing any unreacted source/drain silicide metal from the transistor; and
   b4) second annealing to transform the source/drain silicide into a more stable alloy phase.

4. The method of claim 1, wherein the formation of the gate silicide over the silicon-containing gate and the oxide barrier in the source/drain regions comprises:
   e1) depositing a gate silicide metal over the silicon-containing gate and the oxide barrier in the source/drain regions of the transistor;
   e2) first annealing the gate silicide;
   e3) selectively removing any unreacted gate silicide metal from the transistor; and
   e4) second annealing to form a fully silicided (FUSI) gate for the MOS transistor.

5. The method of claim 1, further comprising
   f) selectively removing the oxide barrier in the source/drain regions after forming the fully silicided (FUSI) gate in the transistor.

6. The method of claim 1, further comprising
   g) forming a pad oxide layer overlying the silicon-containing gate before forming the hardmask overlying the silicon-containing gate, and wherein removing the hardmask from the silicon-containing gate comprises removing the hardmask and the pad oxide layer overlying the silicon-containing gate.

7. The method of claim 6, wherein the oxide barrier formed overlying the source/drain silicide in the source/drain regions is formed thicker than the pad oxide layer overlying the silicon-containing gate.

8. The method of claim 1, wherein the gate silicide is formed using a gate silicide metal and the source/drain silicide is formed using a source/drain silicide metal, and wherein at least one of the gate or source/drain silicide metals comprise:
   Ni, and at least one of Co, Sc, Y, La, Yb, Er, Cs, Ba, Ti, V, Fe, Nb, Cd, Sn, Hf, Ta, and Zr, and has a work function of between about 3.0 eV and about 4.3 eV; and
   the other of the gate silicide metal or source/drain silicide metal comprises at least one of Be, Co, Ni, Se, Rh, Pd, Te, Ru, Re, Ir, Pt and/or Au, and has a work function of between about 4.8 eV and about 6.0 eV; and
   wherein the gate silicide metal or source/drain silicide metal alloys have respective thicknesses of less than about 100 nanometers.

9. The method of claim 1, wherein the gate silicide is formed using a gate silicide metal and the source/drain silicide is formed using a source/drain silicide metal, and wherein the gate silicide metal formed overlying the silicon-containing gate is formed thicker than the source/drain silicide metal formed in the source/drain regions.

10. The method of claim 1, wherein the gate silicide is formed using a gate silicide metal deposition and the source/drain silicide is formed using a source/drain silicide metal deposition, and wherein at least one of the gate and source/drain silicide metal depositions comprise two or more metal depositions.

11. The method of claim 1, wherein at least one of the gate silicide and the source/drain silicide formations comprise two or more annealing operations.

12. The method of claim 11, wherein at least one of the gate silicide and the source/drain silicide annealing operations are combined to reduce the quantity of individual annealing operations.

13. A method of forming a fully silicided (FUSI) gate of a MOS transistor, comprising:
   a) forming a hardmask overlying a silicon-containing gate;
   b) depositing a source/drain silicide metal in source/drain regions of the transistor to form a source/drain silicide in the source/drain regions;
   c) forming a barrier over the source/drain silicide in the source/drain regions; forming a barrier over the source/drain silicide, wherein the forming of the barrier over the source/drain silicide comprises oxidizing a portion of the source/drain silicide to form an oxide barrier overlying the source/drain silicide in the source/drain regions;
   d) removing the hardmask from the silicon-containing gate; and
   e) depositing a gate silicide metal over the silicon-containing gate and the oxide barrier in the source/drain regions to form a fully silicided (FUSI) gate in the transistor, the oxide barrier thereby protecting the source/drain regions from additional silicide formation by the gate silicide metal.

14. The method of claim 13, further comprising:
   f) selectively removing any unreacted gate or source/drain silicide metal from the transistor;
   g) annealing to form a fully silicided (FUSI) gate for the MOS transistor.

15. The method of claim 13, further comprising
   h) selectively removing the oxide barrier in the source/drain regions after forming the fully silicided (FUSI) gate in the transistor.

16. The method of claim 13, wherein the hardmask comprises one of a nitride hardmask and a blocking layer.

17. The method of claim 13, wherein removing the hardmask from the silicon-containing gate comprises removing the hardmask and a pad oxide layer overlying the silicon-containing gate.

18. The method of claim 17, wherein the oxide barrier formed overlying the source/drain silicide in the source/drain regions is formed thicker than the pad oxide layer overlying the silicon-containing gate.

19. The method of claim 13, wherein at least one of the gate silicide metal or source/drain silicide metal comprises:
   Ni, and at least one of Co, Sc, Y, La, Yb, Er, Cs, Ba, Ti, V, Fe, Nb, Cd, Sn, Hf, Ta, and Zr, and has a work function of between about 3.0 eV and about 4.3 eV; and
   the other of the gate silicide metal or source/drain silicide metal comprises at least one of Be, Co, Ni, Se, Rh, Pd, Te, Ru, Re, Ir, Pt and/or Au, and has a work function of between about 4.8 eV and about 6.0 eV; and
   wherein the gate silicide metal or source/drain silicide metal alloys have respective thicknesses of less than about 100 nanometers.

20. The method of claim 13, wherein the gate silicide metal deposited overlying the silicon-containing gate is formed thicker than the source/drain silicide metal deposited in the source/drain regions.

21. The method of claim 13, wherein at least one of the gate and source/drain silicide metal depositions comprise one of two or more metal depositions or two or more dopant species.

22. The method of claim 13, wherein at least one of the gate silicide and the source/drain silicide formations comprise two or more annealing operations.

23. The method of claim 22, wherein at least one of the gate silicide and the source/drain silicide annealing operations are combined to reduce the quantity of individual annealing operations.

24. A method of forming a fully silicided (FUSI) gate transistor, comprising:
   a) forming a nitride hardmask overlying a silicon-containing gate;
   b) providing a source/drain silicide metal in source/drain regions of the transistor to form a source/drain silicide in the source/drain regions;
   c) oxidizing a portion of the source/drain silicide to form an oxide barrier overlying the source/drain silicide in the source/drain regions;
   d) removing the nitride hardmask and a pad oxide layer overlying the silicon-containing gate;
   e) providing a gate silicide metal over the silicon-containing gate to form a fully silicided (FUSI) gate in the transistor, the oxide barrier thereby protecting the source/drain regions from additional silicide formation by the gate silicide metal;
   f) selectively removing any unreacted gate or source/drain silicide metal from the transistor;
   g) annealing the fully silicided (FUSI) gate of the MOS transistor; and
   h) selectively removing the oxide barrier in the source/drain regions.

25. The method of claim 24, wherein at least one of the gate silicide metal or source/drain silicide metal comprises:
   Ni, and at least one of Co, Sc, Y, La, Yb, Er, Cs, Ba, Ti, V, Fe, Nb, Cd, Sn, Hf, Ta, and Zr, and has a work function of between about 3.0 eV and about 4.3 eV; and
   the other of the gate silicide metal or source/drain silicide metal comprises at least one of Be, Co, Ni, Se, Rh, Pd, Te, Ru, Re, Ir, Pt and/or Au, and has a work function of between about 4.8 eV and about 6.0 eV; and
   wherein the gate silicide metal or source/drain silicide metal alloys have respective thicknesses of less than about 100 nanometers.

26. The method of claim 25, wherein the FUSI gate transistor comprises
   a work function of about 4 eV, or
   a work function of about 5 eV.

27. The method of claim 20, wherein at least one of the gate silicide and source/drain silicide metals are added to the silicon-containing gate and the source/drain regions, respectively, by at least one of a deposition, a sputter, and an implantation process.

28. The method of claim 24, wherein the oxide barrier formed overlying the source/drain silicide in the source/drain regions is formed thicker than the pad oxide layer overlying the silicon-containing gate.

29. The method of claim 24, wherein the gate silicide metal provided over the silicon-containing gate is thicker than the source/drain silicide metal provided in the source/drain regions.

30. The method of claim 24, wherein at least one of the gate and source/drain silicide metal depositions comprise one of two or more metal depositions or two or more dopant species.

31. The method of claim 24, wherein at least one of the gate silicide and the source/drain silicide formations comprise two or more annealing operations.

32. The method of claim 31, wherein at least one of the gate silicide and the source/drain silicide annealing operations are combined to reduce the quantity of individual annealing operations.

33. The method of claim 24, wherein at least one of the gate silicide metal or source/drain silicide metal comprises:
   Ni and at least one of Co, Sc, Y, La, Yb, Er, Cs, Ba, Ti, V, Fe, Nb, Cd, Sn, Hf, Ta, Zr, Be, Se, Rh, Pd, Te, Ru, Re, Ir, Pt and/or Au.

* * * * *